United States Patent
Mallikarjunaswamy

(10) Patent No.: US 8,218,276 B2
(45) Date of Patent: Jul. 10, 2012

(54) TRANSIENT VOLTAGE SUPPRESSOR (TVS) WITH IMPROVED CLAMPING VOLTAGE

(75) Inventor: Shekar Mallikarjunaswamy, San Jose, CA (US)

(73) Assignee: Alpha and Omega Semiconductor Inc., Sunnyvale, CA (US)

( * ) Notice: Subject to any disclaimer, the term of this patent is extended or adjusted under 35 U.S.C. 154(b) by 446 days.

(21) Appl. No.: 12/459,461

(22) Filed: Jun. 30, 2009

(65) Prior Publication Data

US 2009/0268361 A1 Oct. 29, 2009

Related U.S. Application Data

(60) Continuation-in-part of application No. 12/454,333, filed on May 15, 2009, now Pat. No. 7,933,102, which is a division of application No. 11/444,555, filed on May 31, 2006, now Pat. No. 7,538,997.

(51) Int. Cl.
    *H02H 9/00* (2006.01)
(52) U.S. Cl. ........................................................ 361/56
(58) Field of Classification Search ...................... 361/56
    See application file for complete search history.

(56) References Cited

U.S. PATENT DOCUMENTS

| 7,804,670 | B2 * | 9/2010 | Reynders et al. | 361/56 |
| 7,880,223 | B2 * | 2/2011 | Bobde | 257/328 |
| 7,933,102 | B2 * | 4/2011 | Mallikararjunaswamy | 361/56 |

* cited by examiner

*Primary Examiner* — Stephen W Jackson
(74) *Attorney, Agent, or Firm* — Bo-In Lin

(57) ABSTRACT

This invention discloses an electronic device formed as an integrated circuit (IC) wherein the electronic device further includes a transient voltage suppressing (TVS) circuit for suppressing a transient voltage. The transient voltage suppressing (TVS) circuit includes a Zener diode connected between a ground terminal and a node for triggering a snapback circuit. In one embodiment, this node may be a Vcc terminal. The TVS device further includes a snapback circuit connected in parallel to the Zener diode for conducting a transient voltage current with a snapback current-voltage (I-V) characteristic upon turning on of the snapback circuit And, the TVS device further includes a snapback suppressing circuit connected in series with the snapback circuit for conducting a current with an I-V characteristic complementary to the snapback-IV characteristic for clamping a snapback voltage.

20 Claims, 7 Drawing Sheets

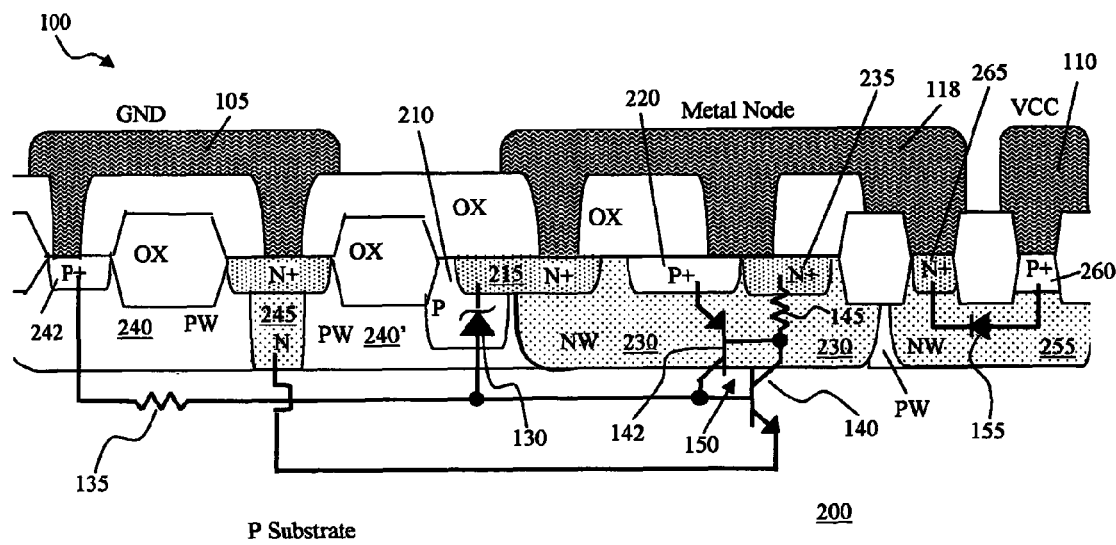
Fig. 3A
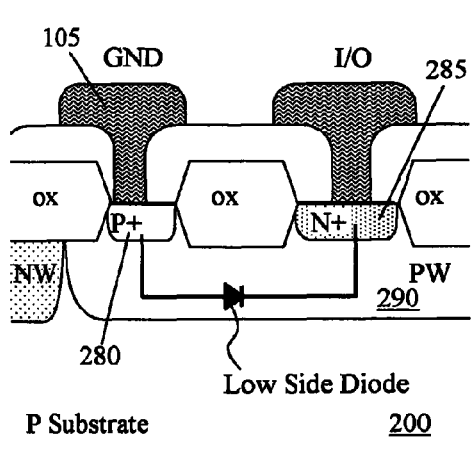 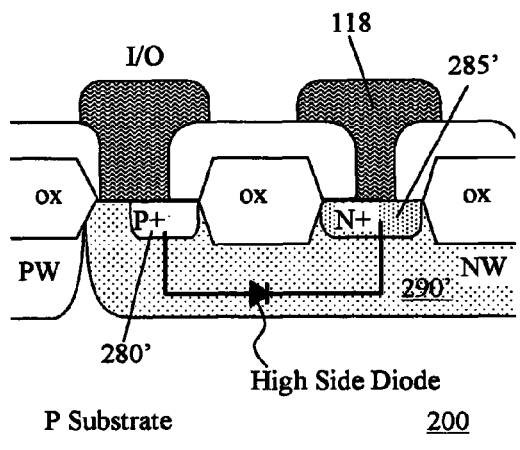
Fig. 3B  Fig. 3C

TRANSIENT VOLTAGE SUPPRESSOR (TVS) WITH IMPROVED CLAMPING VOLTAGE

CROSS REFERENCE TO RELATED APPLICATION

This application is a Continuation-in-Part Application of a patent application Ser. No. 12/454,333 filed May 15, 2009 now U.S. Pat. No 7,933,102, by a common inventor of this application, which is a Divisional of patent application Ser. No. 11/444,555, filed May 31, 2006, by a common inventor of this application, now U.S. Pat. No. 7,538,997. The disclosures made in the patent application Ser. No. 12/454,333 are hereby incorporated by reference in this patent application.

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacturing a transient voltage suppressor (TVS) with improved clamping voltages.

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, digital video interface, high speed Ethernet, notebook computers, monitors and flat panel displays.

FIG. 1A-1 shows a typical commercially available two-channel TVS array 10. There are a pair of steering diode, i.e., diodes 15-H and 15-L, and 20-H and 20-L respectively for each of the two input/output (I/Os) terminals I/O-1 and I/O-2. Furthermore, there is a Zener diode, i.e., main diode 30, with a larger size to function as an avalanche diode from the high voltage terminal, i.e., terminal Vcc, to the ground voltage terminal, i.e., terminal Gnd. At a time when a positive voltage strikes on one of the I/O pads, the high side diodes 15-H and 20-H provide a forward bias and are clamped by the large Vcc-Gnd diodes, e.g., the Zener diode 30. The steering diodes 15-H and 15-L and 20-H and 20-L are designed with a small size to reduce the I/O capacitance and thereby reducing the insertion loss in high-speed lines such as fast Ethernet applications. FIG. 1A-2 shows the reverse current IR versus reverse blocking voltage $V_R$ characteristics between the Vcc and the ground voltage of the TVS array 10 shown in FIG. 1A-1. The reverse current IR as that shown in the diagram of FIG. 1A-2 represents a reverse current conducted through the Zener diode, i.e., between Vcc and GND. Here it is assumed that the reverse breakdown voltage (BV) of each steering diode is higher than the reverse BV of the Zener diode. But note that at high currents when the Vcc to Gnd pad voltage is equal or higher than the summation of the reverse BV of the steering diodes then the current would also flow through all the two series steering diode paths. Since the Zener diode has higher resistance per unit area compared with bipolar junction transistor (BJT) or semiconductor controlled rectifier (SCR) and BJT this is actually a disadvantage at higher currents because the steering diodes also have to be rugged in reverse conduction. In the case of the SCR+BJT the Zener clamp voltage is lower at higher currents and hence the steering diodes paths will not conduct. The breakdown voltage of the Vcc-Gnd diode 30 and the steering diodes 15 and 20 should be greater than the operating voltage (VRWM) so that these diodes only turn-on during the voltage transients. The problem with the Vcc-Gnd clamp diodes is that typically these diodes are very resistive in reverse blocking mode and require large area to reduce resistance. As shown in FIG. 1A-2, the high resistance leads to the increase of BV at high current. This is not desirable as high BV not only causes the break down of steering diodes as described above but also causes damage to the circuit the TVS device intends to protect. The requirement to have large diode size thus limits further miniaturization of a device when such TVS circuit is implemented.

One common method used in the integrated circuits to circumvent this drawback is to use a Zener triggered NPN as the clamp device as that shown in FIG. 1B-1. The TVS circuit 50 shown in FIG. 1B-1 comprises a NPN bipolar transistor 55 connected in parallel to a Zener diode 60 to function as a Zener triggered NPN bipolar TVS device. FIG. 1B-2 shows a current-voltage (IV) diagram for the Zener triggered NPN diode device. FIG. 1B-2 illustrates that when the collector voltage of the NPN 55 reaches the breakdown voltage BV of the Zener diode 60, the NPN bipolar turns-on and snaps back to a lower voltage called the BVceo or holding voltage of the NPN bipolar transistor 55 where BVceo stands for collector to emitter breakdown voltage with base left open. However, in a device that implements a TVS circuit, the snap-back phenomenon is not desirable. The snap-back creates a sudden drop of the reverse voltage that often causes the circuit oscillations due to negative resistance, or can even drop into the operating voltage of the device the TVS circuit is supposed to protect.

In order to resolve the snap-back difficulties, a patent application Ser. No. 12/454,333, of which this application is a Continuation-in-Part, was previously submitted on May 15, 2009 by a common inventor of this application. The disclosures made in that Application are hereby incorporated by reference in this patent application. The TVS circuits as described in the patent application Ser. No. 12/454,333 are implemented with a semiconductor controlled rectified (SCR) circuit to reduce the voltage-drop in a reverse-blocking voltage snap-back when a reverse current transmitted over a Zener diode triggers and turns on an NPN bipolar transistor. The TVS circuits disclosed in the patent application Ser. No. 12/454,333 resolve the difficulties caused by increasing break down voltage due to TVS device resistance and drastic voltage drop due to a snapback that commonly occurs in the conventional TVS circuit. Another aspect of application Ser. No. 12/454,333 was to provide an improved device design and manufacturing method to provide an improved TVS circuit. Furthermore, the TVS invention in the patent application Ser. No. 12/454,333 disclosed a new TVS for integration into mainstream complementary metal oxide semiconductor (CMOS) or Bipolar-CMOS (Bi-CMOS) technology allowing a configuration of single chip TVS protected ICs thus reduced the costs for providing the protected ICs on the electronic devices.

FIG. 1C illustrates the improved snapback profile of the SCR TVS circuit compared to the prior art. However, the reduced snapback shown in patent application Ser. No. 12/454,333 is achieved through elaborate layout configurations and difficult optimizations which can be difficult to design and implement, therefore there is still a need to further improve and simplify the clamping voltage of the TVS device.

Therefore, a need still exists in the fields of circuit design and device manufactures for providing a new and improved circuit configuration and manufacturing method to resolve the above-discussed difficulties. Specifically, a need still exists to provide new and improved TVS circuits that occupy small areas, eliminate or reduce the snapback voltage variations and furthermore that the TVS circuit can further improve the clamp voltage.

SUMMARY OF THE PRESENT INVENTION

It is therefore an aspect of the present invention to provide an improved TVS circuit to have an improved clamping voltage to further improve TVS protection such that the above discussed limitations and difficulties can be resolved.

Another aspect of this invention is to provide TVS protection circuit by combining two components that include a forward biased diode and a semiconductor controlled rectifier (SCR) to reduce the snap back and also to improve the voltage clamping performance.

Another aspect of this invention is to provide TVS protection circuit by connecting a snapback suppressing diode with a snapback circuit in series such that the snapback suppressing diode provide a current-voltage (I-V) characteristic complementary to an I-V characteristic of the snapback circuit such as an SCR circuit such that the snapback is substantially reduced.

Another aspect of this invention is to provide TVS protection circuit with a high side steering diode functioning as a snapback suppressing diode to operate together with an SCR circuit functioning as a snapback circuit such that the snapback suppressing diode complements the I-V operational characteristics during a transient snapback event that the snapback voltage is substantially reduced and a clamping voltage according to the I-V characteristic.

Briefly in a preferred embodiment this invention discloses a transient voltage suppressing (TVS) circuit for suppressing a transient voltage. The transient voltage suppressing (TVS) circuit includes a Zener diode connected between a ground terminal and a node for triggering a snapback circuit. In one embodiment, this node may be a Vcc terminal. The TVS device further includes a snapback circuit connected in parallel to the Zener diode for conducting a transient voltage current with a snapback current-voltage (I-V) characteristic upon turning on of the snapback circuit. And, the TVS device further includes a snapback suppressing circuit connected in series with the snapback circuit for conducting a current with an I-V characteristic complementary to the snapback-IV characteristic for clamping a snapback voltage. In an exemplary embodiment, the snapback circuit further comprising a semiconductor controlled rectifier (SCR). In another exemplary embodiment, the snapback suppressing circuit further comprising a snapback suppressing diode connected in series with the snapback circuit In another exemplary embodiment, the snapback suppressing diode is forward conducting when conducting a transient voltage current. In another exemplary embodiment, the snapback circuit further comprising a NPN bipolar transistor connected with a PNP bipolar transistor thus forming a PNPN semiconductor-controlled rectifier (SCR) structure. In another exemplary embodiment, the snapback suppressing circuit further comprising a snapback suppressing diode connected in series between a Vcc terminal and the node. In another exemplary embodiment, the TVS device further includes a triggering diode connected to the snapback circuit; and the snapback circuit further comprising a NPN bipolar transistor connected with a PNP bipolar transistor thus forming a PNPN semiconductor-controlled rectifier (SCR); wherein the triggering diode having a breakdown voltage BV for triggering the SCR and the BV of the triggering diode is less than or equal to a BVceo of the NPN bipolar transistor where the BVceo stands for a collector to emitter breakdown voltage with the base left open represented by an equation of BV (Trigger Diode)$\leq$BVceo. In another exemplary embodiment, the TVS device further includes an input/output (I/O) pad connected to the node through a high side steering diode and the I/O pad connected to the ground terminal through a low side diode. In another exemplary embodiment, the TVS device further includes an input/output (I/O) pad connected to the node through a high side steering diode and the I/O pad connected to the ground terminal through a low side diode wherein the high side diode further functioning as a snapback suppressing diode for the snapback circuit for triggering the snapback circuit. In another exemplary embodiment, the snapback circuit further comprising a NPN bipolar transistor connected with a PNP bipolar transistor thus forming a PNPN semiconductor-controlled rectifier (SCR) wherein the triggering diode having a breakdown voltage BV for triggering the SCR and the BV of the triggering diode is less than or equal to a BVceo of the NPN bipolar transistor where the BVceo stands for a collector to emitter breakdown voltage with the base left open represented by an equation of BV (Trigger Diode)$\leq$BVceo. In another exemplary embodiment, the TVS device further includes a first input/output (I/O) pad and a second I/O pad connected to the Vcc terminal through a first and a second high side steering diodes respectively and the first and second I/O pads connected to the ground terminal through a first and a second low side steering diodes respectively wherein the first and second high side diode further functioning as snapback suppressing diode for the snapback suppressing circuit. In another exemplary embodiment, the snapback circuit further comprising a NPN bipolar transistor connected with a PNP bipolar transistor thus forming a PNPN semiconductor-controlled rectifier (SCR) wherein the triggering diode having a breakdown voltage BV for triggering the SCR and the BV of the triggering diode is less than or equal to a BVceo of the NPN bipolar transistor where the BVceo stands for a collector to emitter breakdown voltage with the base left open represented by an equation of BV (Trigger Diode)$\leq$BVceo. In another exemplary embodiment, the snapback suppressing circuit further comprising a plurality of diodes connected in series and the plurality of diodes connected in series between the Vcc terminal and the snapback circuit.

This invention further discloses a method for reducing the snapback of a circuit by placing a snapback suppressing diode in series with the circuit. The I-V characteristics of the snapback suppressing diode can be combined with the I-V characteristics of the circuit to reduce the snapback in the circuit. The snapback suppressing diode may be forward conducting. The resistance of the diode can be adjusted to change its I-V characteristics. Also, multiple snapback suppressing diodes may be placed in series.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1B-1 is a circuit diagram for showing another conventional TVS device and FIG. 1B-2 is an I-V diagram for illustrating the reverse characteristics of the TVS device with the voltage presents a sudden snap-back voltage drop at the time when a current conduction over the NPN bipolar transistor is triggered.

FIGS. 3A to 3C are side cross sectional views of circuit components of the TVS device of FIG. 2A supported on a semiconductor substrate for a snapback suppressing diode, low side diode, and a high side diode respectively.

DETAILED DESCRIPTION OF THE METHOD

Figure 2A:
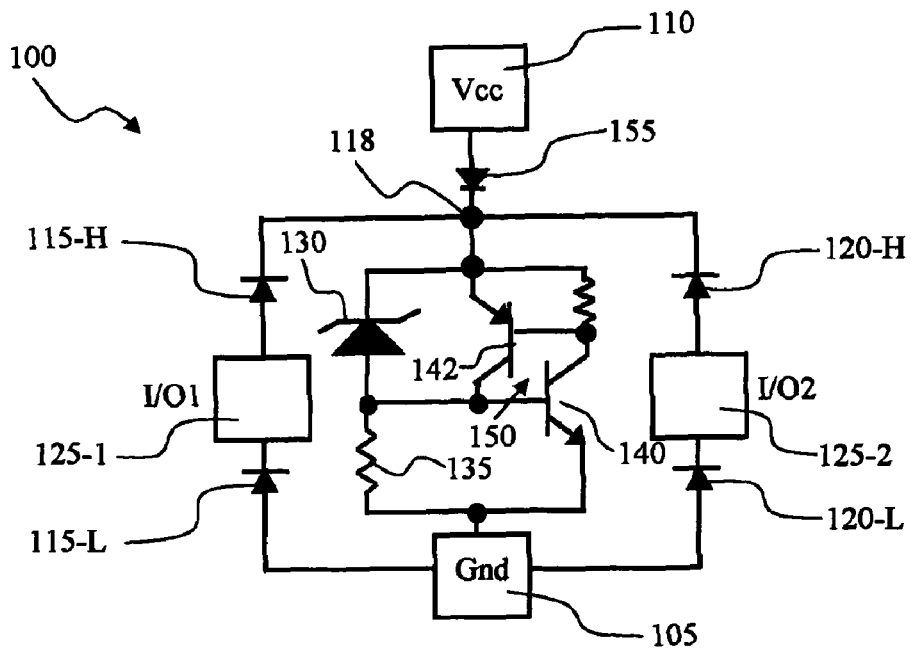
FIG. 2A is a circuit diagram for showing a TVS circuit of this invention and FIG. 2B is an I-V diagram for illustrating the reverse characteristics of the TVS device with significantly reduced snap back voltage drops and further improved voltage clamping.
Figure 2B:
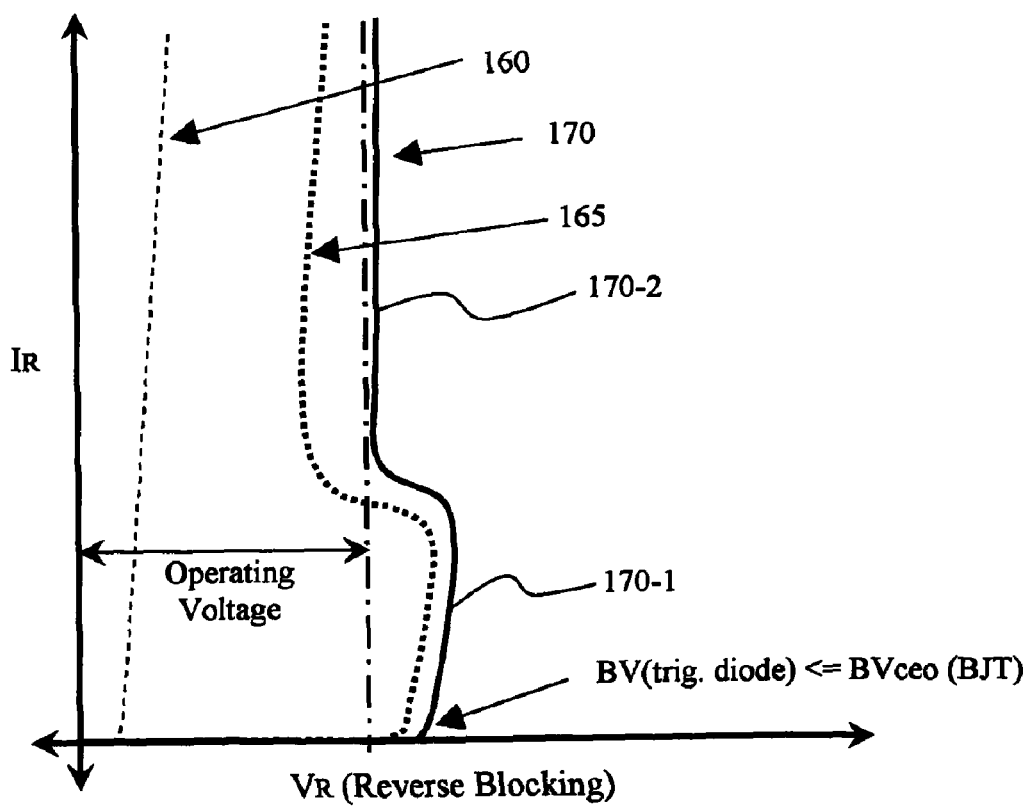

FIGS. 2A and 2B depict respectively a circuit diagram and an I-V diagram, i.e., a current versus voltage diagram, of a TVS circuit 100 of this invention. The TVS circuit 100 is installed between a ground voltage terminal (Gnd) 105 and a Vcc voltage terminal 110 to function as a Vcc-Gnd clamp circuit. The TVS circuit 100 includes a pair of steering diodes, i.e., diodes 115-H and 115-L, and 120-H and 120-L respectively for each of the two input/output (I/Os) terminals 125-1 and 125-2. Furthermore, there is a Zener diode, i.e., diode 130, with a larger size to function as a trigger diode from the high voltage terminal, 110 i.e., terminal Vcc, to the ground voltage terminal, i.e., terminal Gnd. The Zener diode 130 is connected in series with a resistor 135 and in parallel to a PNP bipolar transistor 142 and NPN bipolar transistor 140. The PNP bipolar transistor 142 is configured with a NPN bipolar transistor 140 to form a PNPN silicon-controlled rectifier (SCR) structure 150 with high holding current and voltage. The TVS circuit 100 further includes a snapback suppressing diode 155 connected in series through a node 118 for interconnecting between the Vcc terminal 110 and the SCR 150. The node 118 also functions as a common node connecting to the high side steering diodes 115-H and 120-H. The breakdown voltage, i.e., BV, of the triggering diode 130 is less than or equal to the BVceo of the NPN bipolar transistor 140 or PNP bipolar transistor 142 where BVceo stands for collector to emitter breakdown voltage with the base left open.

$$BV(\text{Trigger Diode}) \leq BV_{ceo}$$

FIG. 2B is a current versus voltage diagram for the operational characteristics of the TVS according to FIG. 2A. As a transient voltage higher than a normal operating voltage is applied to the TVS circuit, a reverse current is triggered to pass through the Zener diode 130 because the breakdown voltage BV of the trigger diode 130 is adjusted to a voltage that is less than the BVceo. As the voltage increases, the device migrates into BJT mode where the NPN 140 conducts. When the voltage increases further the SCR 150 is activated and begins to conduct current. The turning on of the SCR causes a drop of the reverse blocking voltage $V_R$ while the SCR combined with the diode current component, i.e., the SCR-Diode component, negates some of the snapback to keep the voltage substantially at or above the operating voltage thus providing a significantly improved voltage clamping performance.

Specifically, FIG. 2B shows the I-V diagrams, i.e., curve 160 for the snapback suppressing diode 155, wherein the snapback suppressing diode is configured for conducting the transient voltage current in forward conduction mode. It also shows the curve 165 of a typical TVS device similar to TVS device 100, but lacking the snapback suppressing diode 155. The curve 165 exhibits a large snapback, and can even enter the operating voltage of the protected device, which is highly undesirable. If the snapback voltage is lower than the operating voltage, it can undesirably short the supply voltage Vcc during normal operating voltages. The circuit schematic represented by curve 165 may look like one shown in U.S. application Ser. No. 12/454,333, but its implementation does not have elaborate layouts schemes to suppress the snapback, and thus exhibits a large snapback. The curve 170 shows the I-V behavior of the TVS device 100 (including snapback suppressing diode 155). A portion 170-1 of the curve 170 shows the I-V characteristics of the BJT 140 before the SCR 150 is turned on and the curve 170-2 shows when the SCR 150 is turned on. Instead of using complex layout schemes to suppress the snapback, the TVS device 100 employs the snapback suppressing diode 155 to alleviate the snapback. In addition to suppressing snapback in the TVS device 100, the snapback suppressing diode 155 is also able to improve the clamping characteristics of the curve 170, which displays a more vertical profile upon clamping than the old curve 165. In an alternative embodiment, the snapback suppressing diode 155 may be configured to be in reverse blocking mode when conducting a transient voltage current. The purpose of the snapback suppressing diode 155 is to shape the I-V characteristics of the TVS device 100 to suppress snapback, and improve clamping.

By adjusting the BV of trigger diode 130 less than the BVceo and greater than the operating voltage, the voltage is snapped back at when the SCR is turned on while the SCR-Diode voltage is clamped at substantially a constant voltage above the operating voltage. The BV of the trigger diode 130 may be easily adjusted to the desired voltage for triggering the 170-1 portion of the curve 170, even with the addition of the snapback suppressing diode 155. The clamping voltage performance is therefore significantly improved.

The sequence of operation mode provides the benefit of fast response as the NPN transistor turns on fast Furthermore, by turning on the SCR 150 at a SCR trigger voltage to protect the NPN bipolar transistor 140, the increase of BV at high current is minimized as the SCR action incurs the least resistance. This resolves the difficulties of high BV at high current that not only causes the break down of steering diodes but also cause damage to the circuit the TVS device intends to protect.

The detail operation of the TVS system can be further understood from the following descriptions. Typically the TVS is biased in a system with the high voltage terminal Vcc and the ground voltage Gnd connected to the system which needs protection. There are also applications where the Vcc is left floating for specific applications. Then a +Ve or −Ve zap is applied to the I/O terminals with respect to Gnd. When a +Ve zap is applied on I/O the upper diodes are forward biased and when the voltage reaches the trigger diode BV then current flows through the resistor 135 in series with the trigger diode 130. When the drop in the resistor 135 reaches a voltage of about 0.6V then the base-emitter junction of the NPN transistor 140 is forward biased and the NPN transistor 140 turns-on. Now the collector current of the NPN transistor flows through the resistor connected between the emitter and base of the PNP transistor 142. When the potential drop in this resistor 145 reaches a voltage of 0.6V then the emitter of the PNP transistor 142 begins to conduct and the SCR action is initiated. So now the current flows from the anode on the PNP 142 transistor, i.e., the emitter of PNP, to the cathode of the NPN transistor 140, i.e., the emitter of the NPN. On the negative zap the bottom diode turns-on in forward conduction between I/O pad and Gnd and ESD current flows only in this diode path. There is also a condition when a voltage zap is applied to the Vcc at a voltage of +Ve with respect to Gnd. Under this zap condition the current flows through the Vcc-Gnd path, i.e., there is no current conducted in the steering diodes, since the trigger diode breaks down and initiates the SCR as described above. The SCR itself may suppress the snapback slightly compared to a conventional device, but the snapback suppressing diode 155 will shape the I-V characteristics of the device to further suppress snapback and to improve the clamping I-V characteristics.

FIGS. 3A to 3C are cross sectional views showing the TVS array that includes the trigger diode 130 integrated with NPN bipolar transistor 140 and the PNP bipolar transistor 142 forming SCR 150, and two pairs of steering diodes 115-L, 115-H, and 120-L, 120-H (only one pair is illustrated). The TVS device further includes a snapback suppressing diode 155 connected in series between the Vcc terminal 110 and the SCR 150. The new TVS array 100 as shown in FIGS. 3A to 3C is manufactured with mainstream CMOS technology. FIG. 3A shows a TVS array supported on a P substrate 200. A P type region 210 is placed next to an N+ region 215 forming a Zener diode 130 with cathode connecting to a metal node 118. A P+ region 220 also connects to the metal node 118 and the. P+ region 220 is disposed next to an N well region 230 above P substrate 200 forms PNP transistor 142, with P substrate 200 connecting to Gnd pad 105 through P well 240 and P region 242. The lateral path in P substrate 200 from N well 230 to P well 240 provides the resistance for resistor 135. The path from N region 235 to N well 230 provides resistance 145. The N-well 230 disposed above the P-substrate 200 in turn electrically contacting an N-region 245 thus constituting the NPN transistor 140. The P-type region 210 formed next to the N+ region 215 within P well 240 is to tailor the trigger breakdown voltage BV of the trigger diode 130, i.e., the diode formed between the P region 210 and the N+ region 215, to be less than or equal to the BVceo of the NPN transistor 140. The other way of tailoring the BV and BVceo is to increase the gradient of the N doping of N+ region 215 so that the collector to emitter breakdown voltage with the base left open (BVceo) is tailored to the desired value. A combination of the two could also be used to get desired trigger BV and BVceo. A P+ region 260 is formed near the top surface of the N-well 255 at a lateral distance away from the N-well 230. The P+ region is connected to a Vcc metal 110 and forming a diode 155 at the junction of the P+ region 260 interfacing with the N-well 255. The diode 155 is connected in series to the Vcc metal 110 and the metal node 118 through a N+ region 265 formed on a top portion of the N-well 255. The diode 155 thus serving the function of snapback suppressing diode connected in series between the Vcc terminal 110 and the SCR 150 through the common node 118.

FIG. 3B shows the low side steering diode comprises a P+ region 280 and N+ region 285 encompassed in a P-well 290. The low side steering diode can represent diode 115-L or 120-L. The low side diode's anode is connected to GND 105 and its cathode is connected to I/O terminal. GND 105 of FIG. 3B may be connected to GND 105 of FIG. 3A in the third dimension. FIG. 3C shows the high side steering diode comprises a P+ region 280' and N+ region 285' encompassed in a N-well 290'. The high side diode can represent diode 115-H or 120-H, and its anode is connected to the I/O terminal and its cathode connected to metal node 118. The metal node 118 of FIG. 3C may be connected to metal node 118 of FIG. 3A and the I/O terminal of FIG. 3C may connected to the I/O terminal of FIG. 3B in the third dimension. For lowering the capacitance of these diodes and also increasing their BV, a lower doped N− region is added where N+ region is implanted so the process provides an N+/N−/PW diode instead of N+/PW diode. Similar for the high side diode, a P− implantation is added where P+ is so as to give a P+/P−/N-well diode.

Figure 4:
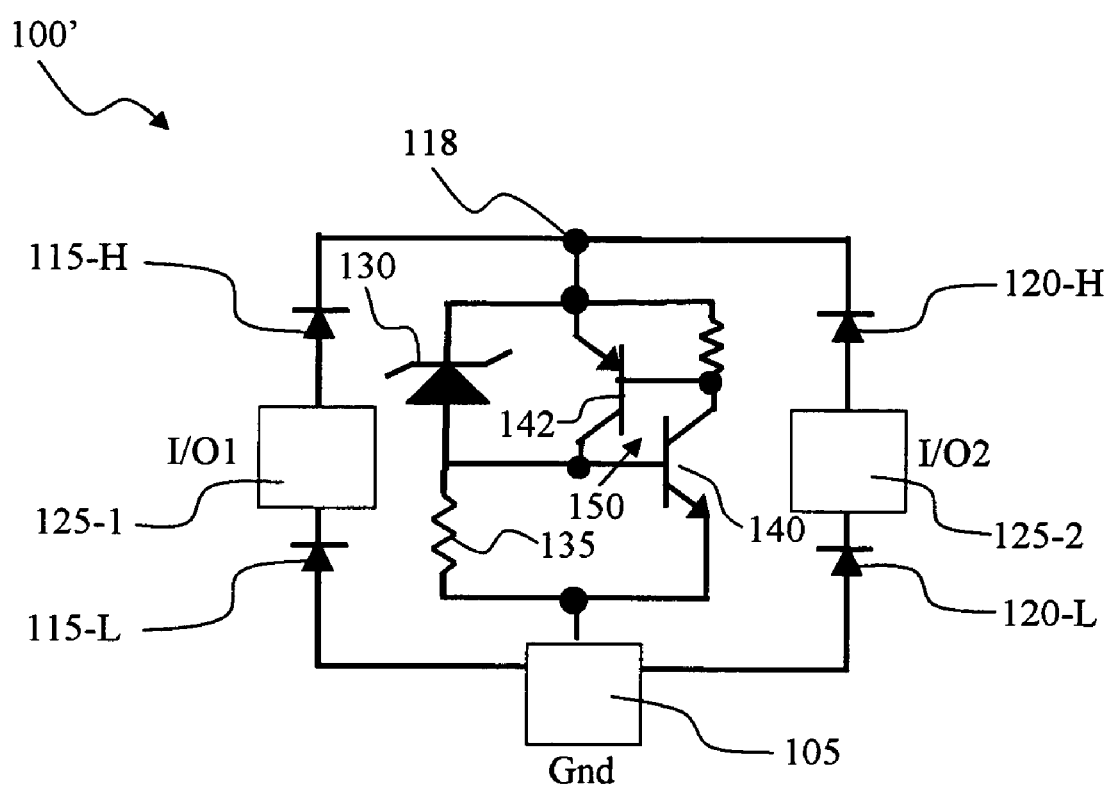
FIG. 4 is a circuit diagram for showing a TVS circuit implemented with a high diode functioning as a snap back suppressing diode without external connection to a Vcc terminal.

FIG. 4 is another circuit diagram to show an alternate embodiment of the present invention with improved clamp capabilities. The TVS system 100' shown in FIG. 4 has similar circuit configuration as that shown in FIG. 2A except that the node 118 is configured as a floating node. That is, the node 118 can be a Vcc pad, but the Vcc is not connected externally. The TVS is not connected to a Vcc through a snapback suppressing diode as that shown in FIG. 2A and the Vcc pad of this device is not connected externally. Therefore, the external current is transmitted into the TVS device through the I/O pad 125-1 (or 125-2). The high side steering diode 115-H (or 120-H) is functioning as a snapback suppressing diode. The configuration of the TVS device can again be simplified without requiring a specialized layout configuration to suppress the snapback. Instead, the high side diode 115-H is used to adjust the snapback characteristics of the SCR 150.

Figures 1, 1A:
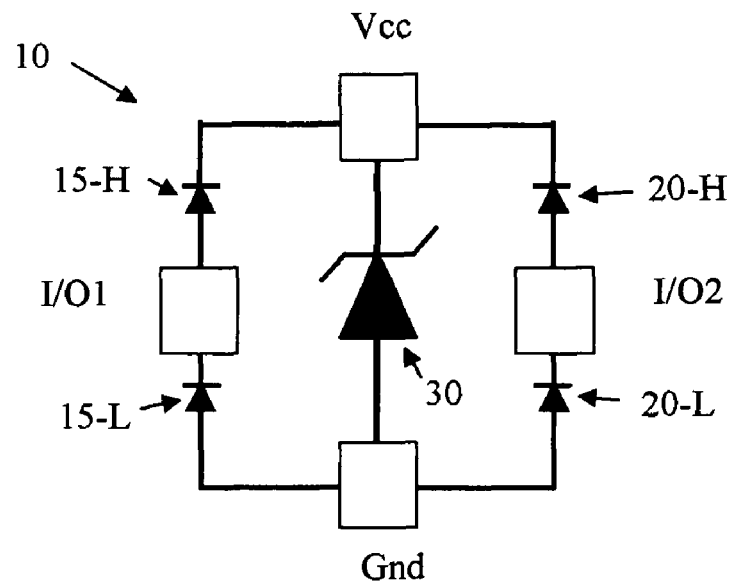
FIG. 1A-1 is a circuit diagram for showing a conventional TVS device and FIG. 1A-2 is an I-V diagram, i.e., a current versus voltage diagram, for illustrating the reverse characteristics of the TVS device.
Figures 1, 1A, 2:
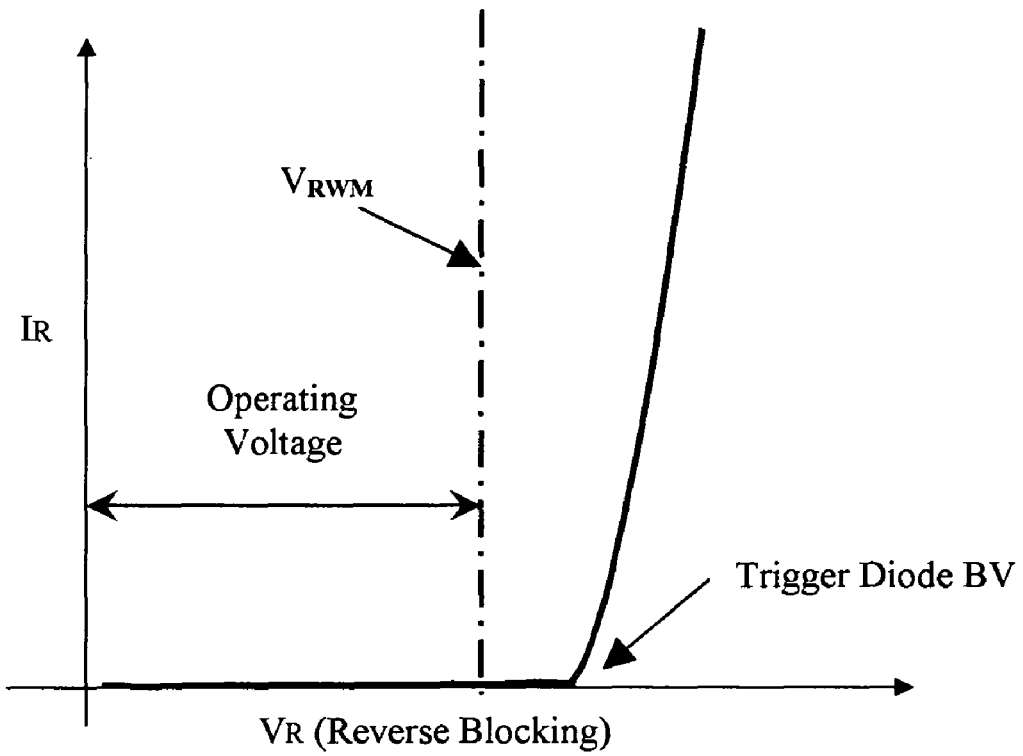
Figures 1, 1B:
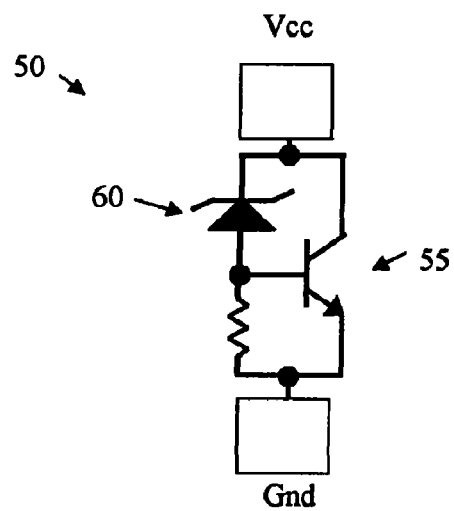
Figures 1, 1B, 2:
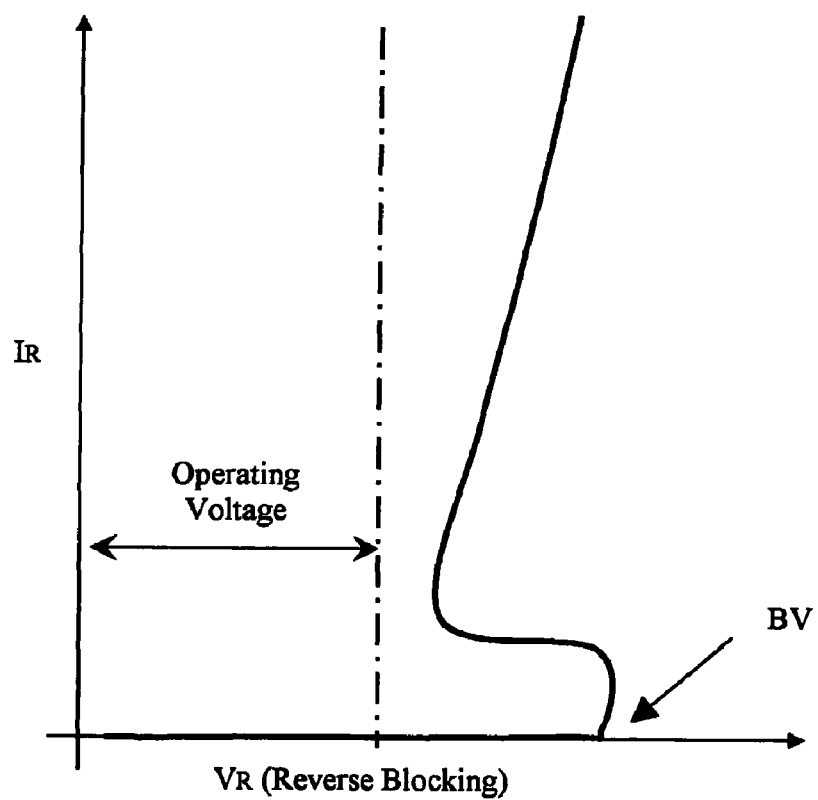
Figure 1C:
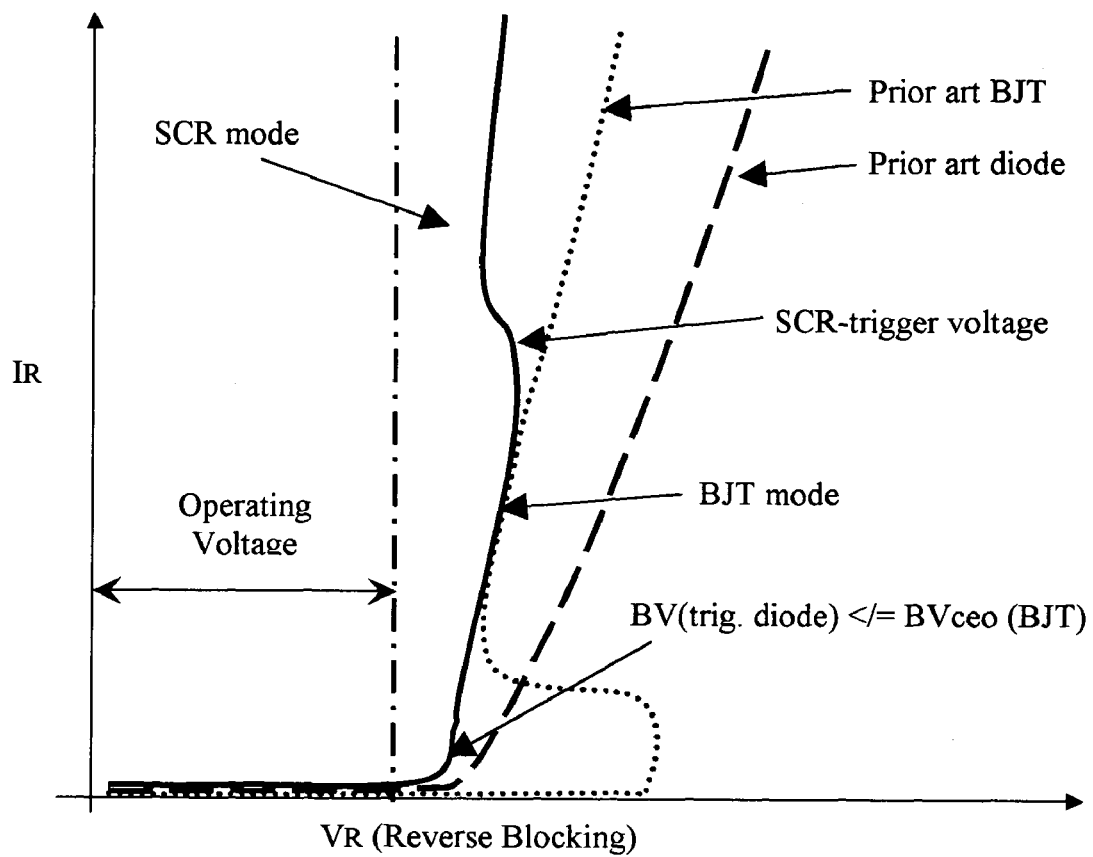
FIG. 1C is an I-V diagram for illustrating an improved snap-back reduction TVS circuit as that disclosed in patent application Ser. No. 12/454,333 filed by an inventor of the present invention.
Figure 5:
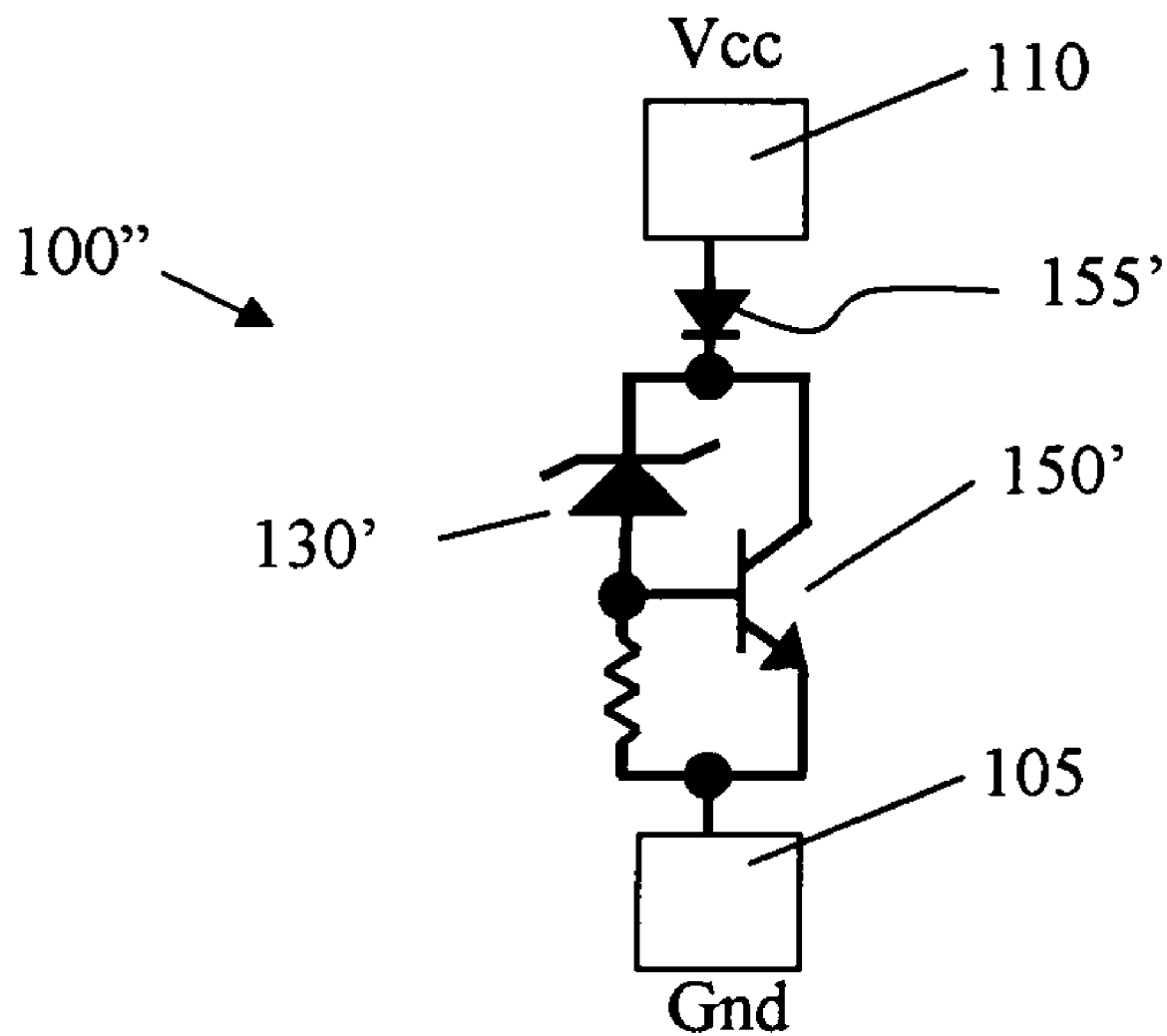
FIG. 5 is a circuit diagram of another TVS device implemented with a snapback circuit combined with a snapback suppressing circuit such as a diode to achieve reduced snapback and improved clamp voltage.

FIG. 5 is another diagram to illustrate the essence of this invention. Specifically, a TVS device 100" is connected between a Gnd terminal 105 and a Vcc terminal 110. The TVS device 100" includes a Zener diode 130' for conducting a transient current therethrough. The Zener diode 130' is connected in parallel to a snapback circuit 150', such as a SCR 150 shown in FIG. 2A or the NPN bipolar transistor of FIG. 1B-1, for conducting a reverse current with an I-V characteristic to turn on the snapback circuit 150' similar to that shown in FIG. 2B. The TVS device 100" further includes a snapback suppressing diode 155' connected in series between the Vcc terminal 110 and the snapback circuit 150' to provide an I-V characteristic that is complementary to the snapback characteristic of the snapback circuit such that a voltage suppressing performance during a transient voltage event is significantly improved by combining the I-V characteristic of the snapback circuit 150' with the I-V characteristic of the snapback suppressing diode 155'.

According to FIGS. 3A to 3C, this invention discloses an electronic device with the snapback suppressing diode and the SCR TVS device (which may include a triggering diode) are integrated with the electronic device on a single chip. In a preferred embodiment, the snapback suppressing diode and the SCR TVS are manufactured with a standard CMOS technology and integrated with the electronic device on a single chip. In another embodiment, the snapback suppressing diode and the SCR TVS are manufactured with a standard Bi-CMOS technology and integrated with the electronic device on a single chip. In another embodiment, the TVS further includes a second SCR anode connected in parallel to a first SCR anode of the SCR with the first SCR anode triggering a current through the second SCR for further limiting an increase of a clamping voltage. In another embodiment, the TVS further includes high side and low side diodes. In another embodiment, the snapback suppressing diode, the triggering and high side and low side diodes, and the SCR are formed in a semiconductor substrate by implanting and configuring dopant regions of a first and a second conductivity types in a N-well and a P-well whereby the TVS can be formed in parallel as part of the manufacturing processes of a CMOS or Bi-CMOS electronic device.

With the above circuit diagrams and the device cross sections, the invention shows the TVS operations and array integration of the improved TVS devices. These TVS devices provide improved clamp protections that occupy smaller area and perform good clamping function because the SCRs are able to carry high currents with little voltage drop beyond trigger diode breakdown. To one skilled in the art, it should be clear that this invention provides a simple and useful method of adding a forward conducting diode to suppress the I-V snapback of a device. The slope of the I-V characteristics of the snapback suppressing diode can be easily adjusted by changing the resistance of the diode. Multiple diodes can be placed in series to further modify the I-V characteristics and to reduce the capacitance of the snapback suppressing diodes.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A transient voltage suppressing (TVS) circuit comprising:
    a snapback circuit connected between a ground terminal and a node for conducting a transient voltage current with a snapback current-voltage (I-V) characteristic upon turning on of said snapback circuit; and
    a snapback suppressing circuit connected in series with said snapback circuit for conducting a current with an I-V characteristic complementary to the snapback-I-V characteristic for clamping a snapback voltage;
    wherein said snapback suppressing circuit further comprising a snapback suppressing diode.

2. The transient voltage suppressing (TVS) circuit of claim 1 wherein:
    said snapback suppressing diode is configured for forward conducting a transient voltage current.

3. The transient voltage suppressing (TVS) circuit of claim 1 wherein:
    said snapback circuit further comprising a semiconductor controlled rectifier (SCR).

4. The transient voltage suppressing (TVS) circuit of claim 3 further comprising:
    a Zener diode connected in parallel to said SCR to function as a triggering diode for said SCR.

5. The transient voltage suppressing (TVS) circuit of claim 1 wherein:
    said snapback circuit further comprising a NPN bipolar transistor connected with a PNP bipolar transistor thus forming a PNPN semiconductor-controlled rectifier (SCR) structure.

6. The transient voltage suppressing (TVS) circuit of claim 1 further comprising:
    a Vcc terminal wherein
    said snapback suppressing diode is connected in series between said Vcc terminal and said node.

7. The transient voltage suppressing (TVS) circuit of claim 1 further comprising:
    a triggering diode connected to said snapback circuit; and
    said snapback circuit further comprising a NPN bipolar transistor connected with a PNP bipolar transistor thus forming a PNPN semiconductor-controlled rectifier (SCR); wherein said triggering diode having a breakdown voltage BV for triggering said SCR and the 13V of the triggering diode is less than or equal to a BVceo of the NPN bipolar transistor where the BVceo stands for a collector, to emitter breakdown voltage with the base left open represented by an equation of BV (Trigger Diode) ≦BVceo.

8. The transient voltage suppressing (TVS) circuit of claim 1 further comprising:
    an input/output (I/O) pad connected to said node through a high side steering diode and said I/O pad connected to said ground terminal through a low side steering diode.

9. The transient voltage suppressing (TVS) circuit of claim 8 wherein:
    said high side steering diode further functions as said snapback suppressing diode.

10. The transient voltage suppressing (TVS) circuit of claim 8 further comprising:
    a triggering diode connected in parallel to said snapback circuit;
    wherein said snapback circuit further comprising a NPN bipolar transistor connected with a PNP bipolar transistor thus forming a PNPN semiconductor-controlled rectifier (SCR) wherein said triggering diode having a breakdown voltage BV for triggering said SCR and the BV of the triggering diode is less than or equal to a BVceo of the NPN bipolar, transistor where the BVceo stands for a collector to emitter breakdown voltage with the base left open represented by an equation of BV (Trigger Diode)≦BVceo.

11. The transient voltage suppressing (TVS) circuit of claim 1 wherein:
    said snapback suppressing circuit further comprising a plurality of snapback suppressing diodes connected in series.

12. The transient voltage suppressing (TVS) circuit of claim 10 further comprising:
    a Vcc terminal wherein said snapback suppressing diode is connected in series between said Vcc terminal and said node and wherein said snapback suppressing diode is configured for forward conducting a transient voltage current.

13. A method of suppressing the snapback of a circuit comprising:
    placing a snapback suppressing diode in series with a circuit having snapback characteristics to suppress the snapback.

14. The method of claim 13 wherein:
    implementing said snapback suppressing diode to adjust the current-voltage (I-V) characteristics of said circuit to suppress the snapback.

15. The method of claim 13 further comprising:
    modifying the current-voltage (I-V) characteristics of said snapback suppressing diode by changing the forward resistance of the diode.

16. The method of claim 13 further comprising:
    connecting multiple snapback suppressing diodes in series with said circuit having said snapback characteristics.

17. The method of claim 13 wherein:

configuring said circuit having said snapback characteristics comprises configuring a transient voltage suppressor (TVS) circuit having said snapback characteristics.

18. The method of claim 17 wherein:

configuring said circuit having snapback characteristics by implementing a semiconductor controlled rectifier (SCR) and a triggering diode.

19. The method of claim 17 wherein:

said step of placing a snapback suppressing diode also improves a current voltage (I-V) clamping characteristic of said TVS.

20. The method of claim 17 wherein:

said step of placing a snapback suppressing diode further comprises configuring said snapback suppressing diode for forward conducting a. transient voltage current.

\* \* \* \* \*